United States Patent [19]

Sumi

[11] 4,145,615
[45] Mar. 20, 1979

[54] ELECTRON BEAM EXPOSURE APPARATUS

[75] Inventor: Masahiko Sumi, Yokohama, Japan

[73] Assignee: Tokyo Shibaura Electric Co., Ltd., Kawasaki, Japan

[21] Appl. No.: 820,707

[22] Filed: Aug. 1, 1977

[30] Foreign Application Priority Data

Jul. 30, 1976 [JP] Japan .................................. 51-90182

[51] Int. Cl.$^2$ ........................ A61K 27/02; G21K 1/08
[52] U.S. Cl. .......................... 250/492 A; 250/396 ML
[58] Field of Search .............................. 250/492 A, 396

[56] References Cited

U.S. PATENT DOCUMENTS

| 3,257,555 | 6/1966 | Klebba | 250/492 A |
| 3,914,608 | 10/1975 | Malmberg | 250/492 A |
| 4,063,103 | 12/1977 | Sumi | 250/492 A |

Primary Examiner—Harold A. Dixon
Attorney, Agent, or Firm—Oblon, Fisher, Spivak, McClelland & Maier

[57] ABSTRACT

An electron beam exposure apparatus includes an electron beam emitting system having a means for varying the width of an electron beam. In this apparatus a plurality of identical pattern portions corresponding to a plurality of minimum width scanning lines are scanned one at a time, by an electron beam of a width corresponding to the number of repetitions of the minimum width scanning lines, according to the repetition information of the minimum width scanning lines of the electron beam.

4 Claims, 6 Drawing Figures

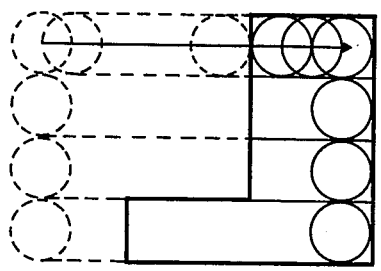
F I G. 1
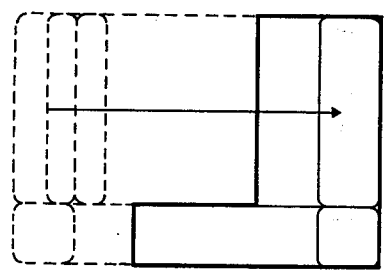
F I G. 2
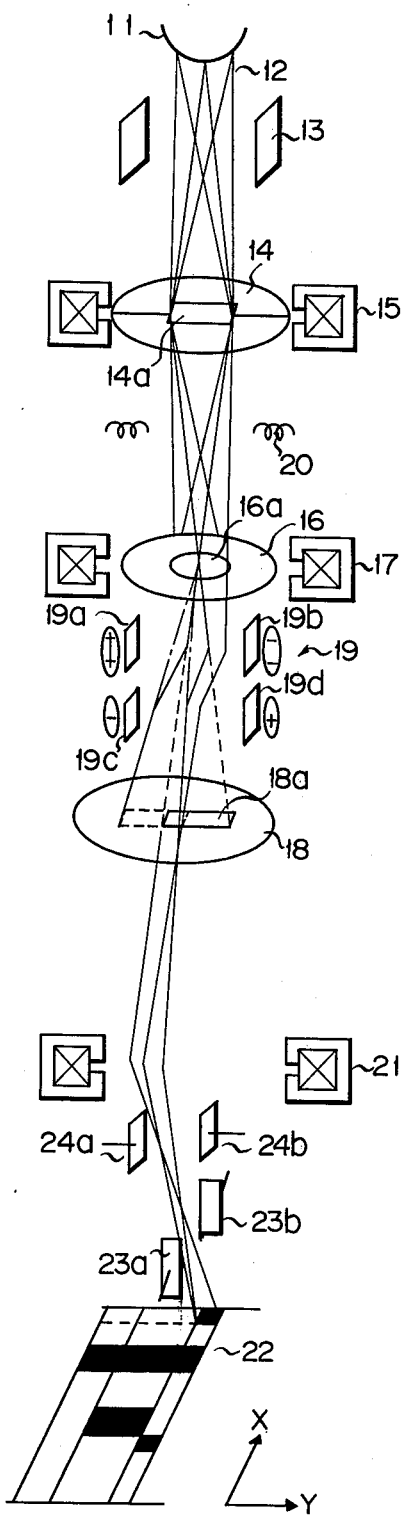
F I G. 3

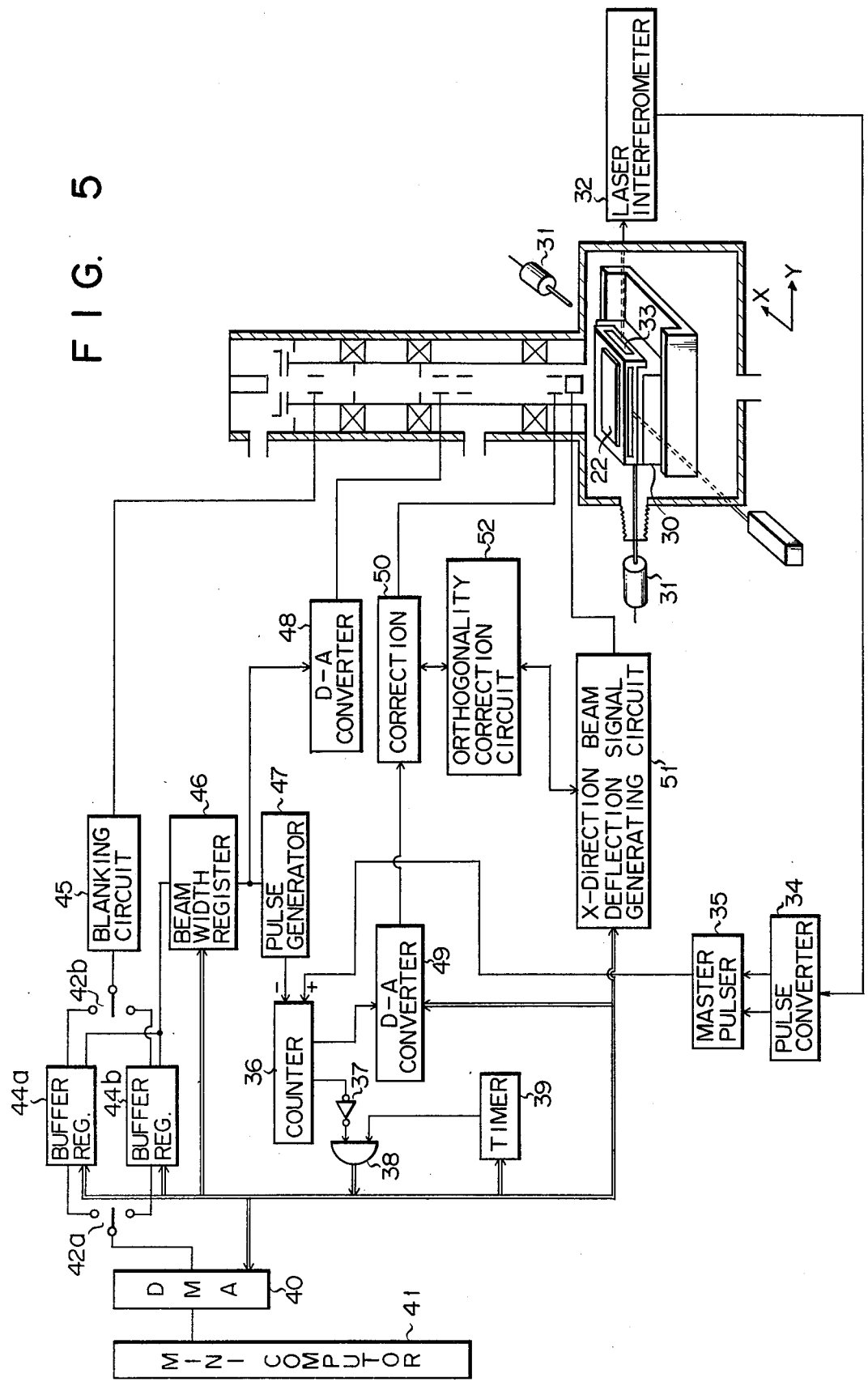

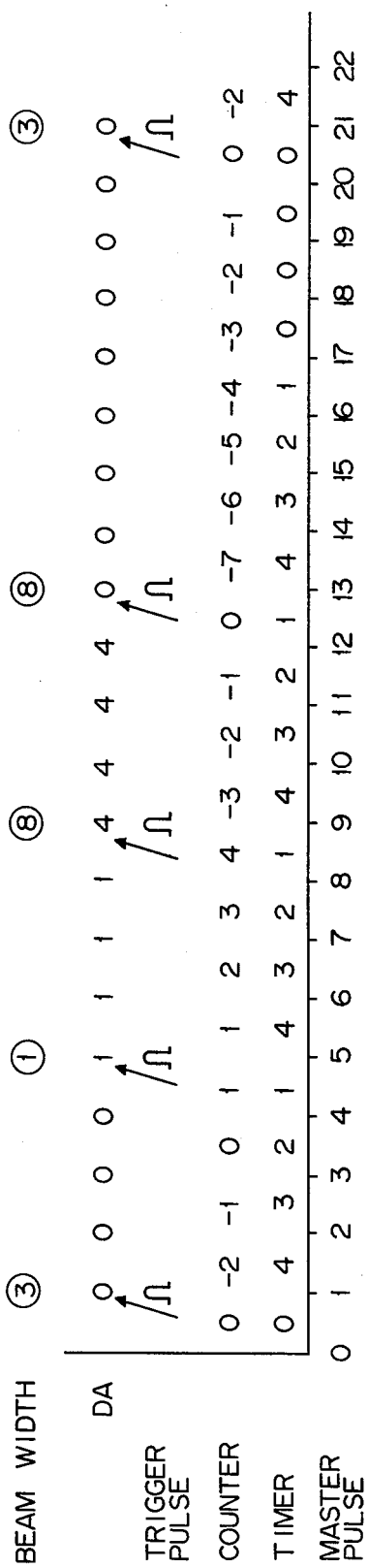

ELECTRON BEAM EXPOSURE APPARATUS

BACKGROUND OF THE INVENTION

This invention relates to an electron beam exposure apparatus for forming a predetermined pattern on an object to be exposed.

In a conventional exposure apparatus, for example, an electron beam exposure apparatus as disclosed in the copending U.S. Pat. application Ser. No. 675,170 filed on Apr. 8, 1976, now U.S. Pat. No. 4,063,103 when a pattern of, for example, LSI is described directly on a wafer, information corresponding to the pattern to be described is read out of a minicomputer, a blanking signal and deflection signal as generated in response to the information are supplied to an electron beam emitting system to blank and deflect the electron beam having a fixed beam width. A pattern scanning is effected by electron beam on the wafer a plurality of times to form a pattern. According to this apparatus, however, a pattern describing speed is limited by a data transfer speed (20 Mbit/sec) of the minicomputer.

SUMMARY OF THE INVENTION

It is accordingly an object of this invention to provide an electron beam exposure apparatus a pattern description can be made at a speed faster than a describing speed as restricted by a data transfer rate. An examination was made of the nature of an LSI pattern formed on a wafer by a plurality of scanning lines having a fixed beam width. As the result, it has been found that some of pattern portions, corresponding to scanning lines as continuously appearing during the scanning are often different, but that on the average four pattern portions corresponding to four scanning lines have the same pattern information. This invention is based on this discovery. According to this invention the width of an electron beam can be varied utilizing the nature of the pattern. That is, a plurality of pattern portions having the same information and corresponding to a plurality of scanning lines, respectively, can be described one at a time by the corresponding electron beam of a width corresponding to the plurality of scanning lines, thus improving the describing speed.

This invention can be further described by way of example by referring to the accompanying drawings, in which:

BRIEF DESCRIPTION OF THE DRAWING

FIG. 1 is a view showing the state of a scanning by a conventional exposure apparatus;

FIG. 2 is a view showing the state of a scanning by an electron beam exposure apparatus according to this invention;

FIG. 3 is a view showing an electron beam emitting system used in the electron beam exposure apparatus of this invention;

FIG. 5 is a block diagram showing an electron beam exposure apparatus according to one embodiment of this invention; and FIG. 6 shows information on various circuit portions of the electron beam exposure apparatus as appearing according to the configuration of a pattern to be described.

DETAILED DESCRIPTION OF THE PREFERRED EMBODIMENTS

Figure 4:
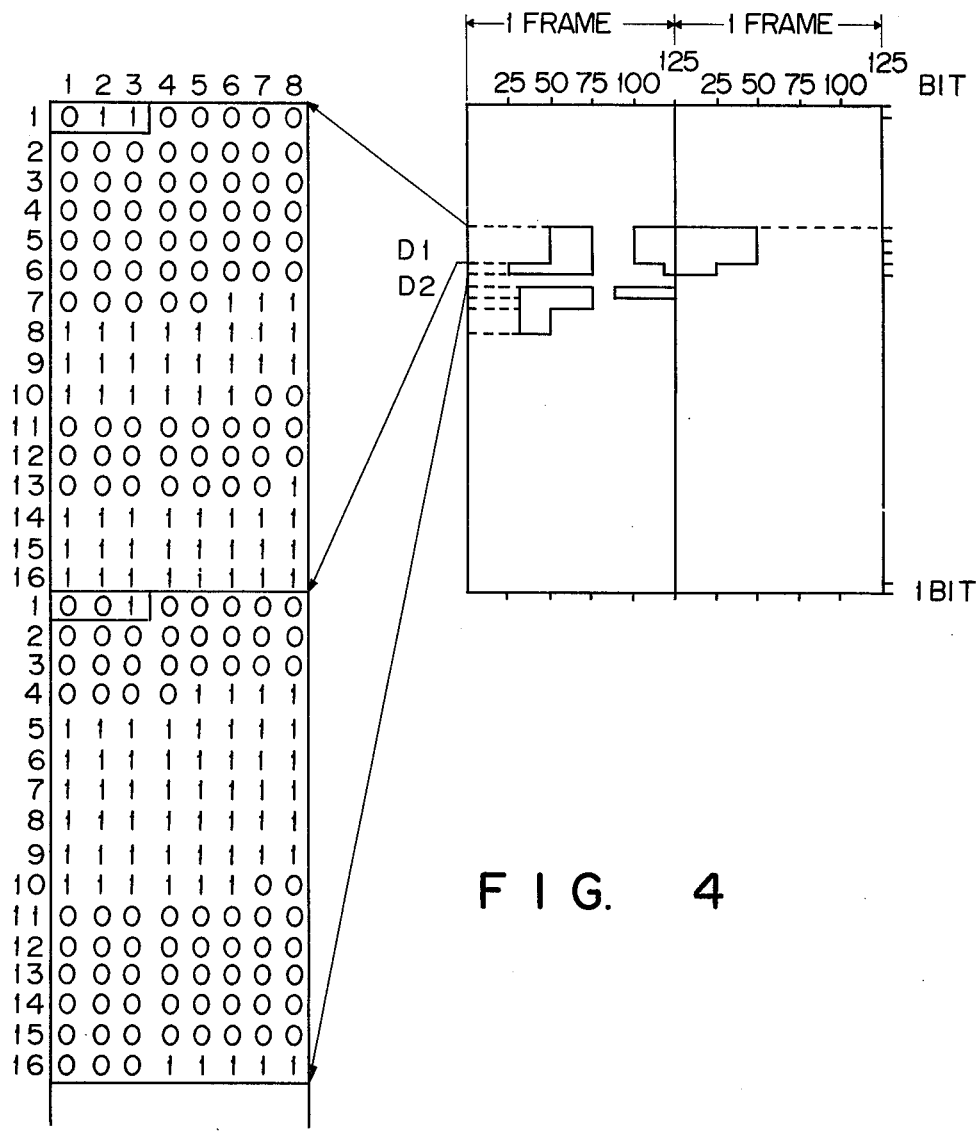
FIG. 4 shows a pattern to be described and a form of a binary information corresponding to this pattern.

FIGS. 1 and 2 show scanning states obtained by a conventional scanning system for describing an inverted L-shaped pattern and a corresponding scanning system according to this invention, respectively. In the conventional scanning system shown in FIG. 1, four scannings are effected by an electron beam having a fixed beam width of $1\mu$ in diameter to describe such an inverted L-shaped pattern. In the scanning system according to this invention, on the other hand, only two scannings are effected to describe such inverted L-shaped pattern, i.e. once by an electron beam of $3\mu$ in width and once by an electron beam of $1\mu$ in width. In consequence, the pattern can be described at a speed twice as fast as in the conventional scanning system. This case is given by way of example. The scanning system of this invention was used with respect to an actual IC (integrated circuit) pattern and it has been found that the describing speed is, on the average, four times as fast as in the conventional system. The above-mentioned beam width varying scanning method is effected by the following means.

FIG. 3 shows an electron beam emitting system capable of varying a beam width. As will be understood from FIG. 3 a radiant beam or an electron beam 12 emitted from a cathode 11 has its path deflected by a pair of blanking electrodes 13 and, where unnecessary, greatly deflected so as not to permit it to pass through an aperture 14a (a rectangular aperture of $20\mu \times 160\mu$) of a mask 14. Where necessary, the electron beam 12 passes through the aperture 14a of the mask 14 to provide an imaginary light source of the electron beam emitting system. The electron beam 12 leaving the mask 14 is converged by an electron lens 15 onto the center of a circular aperture 16a of a mask 16. An electronic lens 17 is positioned around the mask 16 to permit an image from the imaginary light source as provided at the aperture 14a to be focussed onto a slit 18a of a mask 18. The slit 18a and a later-described electrode group 19 constitute a main construction for varying the beam width. The electrode group 19 is constituted of two pairs of electrodes 19a, 19b and 19c, 19d, each pair of electrodes facing each other with in a manner that the electron beam path therebetween. The path of the electron beam is adjusted by an aligning member 20 to permit the electron beam to be passed through the $20\mu \times 160\mu$ slit of the mask 18 when the electrodes 19a to 19d are at a level of 0V. When voltages $+60V$ and $-60V$ are applied to the electrodes 19a and 19b, respectively, and $-30V$ and $+30V$ are to the electrodes 19c and 19d, respectively, the electron beam is focussed onto the mask 18, as indicated by solid lines in FIG. 3, in a manner to be deviated $120\mu$ to the left. As a result, the electron beam of $20\mu \times 40\mu$ is passed through the slit 18a and, after reduced by an electronic object lens 21 and 1/20, is focussed as a $1\mu \times 2\mu$ image onto an object 22 to be exposed. When the voltage applied to the electrode 19a is varied in a range of 10V and the voltages applied to the other electrodes 19b, 19c and 19d are varied in proportion to the voltage variation of the electrode 19a, the beam landing onto a mask 18 is shifted to the right, or to the left, at a rate of $20\mu$. That is, the width of the electron beam passed through the slit 18a of the mask 18 is varied at a rate of $20\mu$. In consequence, the beam width is varied in units of $1\mu$. By so doing, the beam width can be varied on the object 22 from $1\mu \times 1\mu$ to $1\mu \times 8\mu$. If the percentage of reduction of the beam is varied by varying the power of the object lens 21, the beam width can be varied, for example, in units of $\frac{1}{4}\mu$. The reason why the electrode group 19 is constituted by two pairs of electrodes is based on the consideration that a paraxial ray is used to prevent aberration. For this reason, the electron beam diverged from the center of the aperture 16a of the mask 16 can be regarded as a flux of electron. If the electrodes 19c and 19d are not provided, when the width of electron beam is varied on the surface of the object 22 by the electrodes 19a and 19b, the image formed by the electron beam is unwantedly deformed. Furthermore, since a point deviated from the center of the cathode 11 is regarded as the center of an electron beam emitting source, no excellent image is obtained. According to this invention, an electron beam deflected in a direction by the electrodes 19a and 19b is again deflected in the opposite direction by the electrodes 19c and 19d so that the center of the cathode is regarded as the center of the electron beam emitting source. Thus, an excellent image is formed on the mask 18 by the electron beam deriving from the center of the cathode. The electrode group 19 may be disposed between the lens 15 and 17. The electron beam subjected to the center axis correction and controlled in its width by the slit 18a of the mask 18 is deflected by deflection electrodes 23a, 23b in a direction orthogonal to the beam width i.e. in an X-direction thereby to describe a pattern on the surface of the object 22. At this time, the beam is operatively deflected by the blanking electrodes 13 according to pattern information so that the beam does not pass through the aperture 14a of the mask 14, i.e. so-called blanking is effected. Since the beam width of the pattern being described on the object 22 is arbitrarily varied according to the pattern information the position of the beam has to be corrected on the basis of the pattern information in a direction orthogonal to the X-direction, i.e. in a Y-direction. The Y-direction correction is conducted by Y-direction correction electrodes 24a, 24b.

The way how the above-mentioned electron beam emitting system is controlled in forming a predetermined pattern on the object will be explained by referring to FIGS. 4 and 5 conjointly. In this embodiment, one-bit information corresponds to each $1\mu \times 1\mu$ pattern element and, as shown in FIG. 4, a logic "1" is set for the pattern element corresponding to the pattern to be described and a logic "0" for the pattern element not corresponding to the pattern. The logics "1" and "0" may be set in a reversed way. A logic block is so formed as shown in FIG. 4. 1 to 16 as shown in the longitudinal direction of the logic block indicate bytes and 1 to 18 as indicated in the lateral direction of the logic block indicates bits in the byte. The eighth bit in the first byte is followed by the first bit in the second byte in the logic block. The first to third bit of the first byte represent a beam width in the form of a binary notation. Now consider that, for example, a portion $D_1$ of the pattern is described. In this case, three scannings are required in the conventional scanning system, while according to this invention only one scanning is required, as shown in FIG. 2.

In FIG. 5 the object 22 is placed on an X-Y slide carriage which in turn is continuously moved by a driving device 31 in the X and Y directions. The movement of the carriage 30, for example, in the Y-direction is directed by a laser interferometer 32 which is disposed in an opposed relation to a mirror 33 mounted on the carriage. The output signal of the laser interferometer 32 which corresponds to an amount of movement of the carriage is supplied to a pulse converter 34. The pulse converter 34 generates one pulse for each $\frac{1}{8}\lambda$ movement of the carriage 30. Where a helium-neon laser beam of 6,328Å is used in the laser interferometer, 12 pulses from the pulse converter 34 corresponds to the $1\mu$ movement of the carriage 30. A master pulser 35 generates one master pulse when it is supplied with 12 pulses from the pulse converter 34. In consequence, one pulse is generated for each about $1\mu$ movement of the carriage 30. The output pulse of the master pulser 35 is supplied to the Y-direction correction counter 36 to cause its content to be counted up. The higher order bit of the counter 36 is weighted to "0" when the content of the counter is 0 or a positive value. The output of the counter 36 is supplied to one input of an AND gate 38 through an inverter 37 and the output of a timer 39 is coupled to the other input of the AND gate. The AND gate 38 generates an output pulse upon receipt of the output of the counter 36 and output of the timer 39. The output pulse of the AND gate 38 functions as a trigger pulse for driving a beam exposure device. When the trigger pulse is supplied to the timer 39, the timer is rest and supplies no output signal to the AND gate 38 during the following $40\mu$ period. In consequence, the AND gate delivers no output during that time even if the other requirement of the AND gate is met. The reset period of the timer corresponds to the time $40\mu$sec during which one scanning is effected by the electron beam.

The trigger pulse of the AND gate 38 is also supplied to a direct memory access (DMA) circuit 40 for access to a computer 41. When the DMA circuit 40 has access to the computer 41 to read out the pattern information corresponding to one scanning line from the computer 41, The pattern information is stored, through a switch 42a, for example in a buffer register A 44a. On the other hand, pattern information which has been stored by a preceding operation in a buffer register B 44b is read out and supplied bit by bit to a blanking circuit 45 through a switch 42b. At this time, 3-bit information representative of the beam width, which has been stored in the buffer register B 44b, is supplied to a beam width register 46. Suppose that the 3-bit information is "011" as shown in FIG. 4. Then, the beam width information is decoded, by a beam width register 46, as $3\mu$ and a pulse generator 47 generates 3 pulses in response to the output signal of the shift register 46. When the output pulse of the pulse generator 47 is supplied to the counter 36, the contents of the counter 36 are subtracted by an amount corresponding to the number of pulses (three pulses in this case). The beam width information of the beam width register 46 is supplied to a D-A converter 48 where it is converted to a voltage signal having a level corresponding to the beam width. The output signal of the D-A converter 48 is supplied to the electrodes 19a, 19b for beam width setting. The beam width is set for each scanning which is made within $1\mu$sec. Since in this case the contents of the counter are subtracted by three counts i.e. the beam width corresponding to three scannings is set, the scanning area corresponding to three scannings are scanned one at a time. The contents of the counter 36 are converted by a D-A converter 49 to a voltage signal, which is in turn supplied to a Y-direction correction circuit 50. The output of the Y-direction correction circuit 50 is supplied to the electrodes 24a, 24b as shown in FIG. 3 to permit the beam to be deflected in the Y-direction according to the beam width. At this time a deflection signal is generated from an X-direction beam deflection signal generating circuit 51 in response to a trigger pulse generated from the AND gate 38, and supplied to the electrodes 23a, 23b as shown in FIG. 3 to permit the object 22 to be scanned in the X-direction by the electron beam having the set beam width. Since in such a scanning operation the X-direction scanning electrodes 23a, 23b can not be made completely orthogonal to, or parallel to, the X and Y moving directions, an orthogonality correction circuit 52 is provided for correcting the degree of orthogonality and parallelism. The orthogonal correction circuit is adapted to feed the output of the X-direction beam deflection signal generator 51 to the input of the Y-direction correction circuit 50 or the output of the circuit 50 to the input of the generator 51 at a proper intensity, to form a linear combination of these signals, thereby to obtain a coordinate.

FIG. 6 shows a variation of the values of the counter 36, trigger pulse, timer 39 and DA converter 49 with respect to the master pulse of the master pulser 35 when a pattern is described with a beam width of $3\mu$—$1\mu$—$8\mu$—$8\mu$—$3\mu$. In this case, it is assumed that the scanning speed equals the moving speed of the carriage when the pattern is described with the beam having a width of $4\mu$. When two pattern portions are described with a beam of $3\mu$ in width and a beam of $1\mu$ in width the scanning speed tends to be delayed in comparison with the moving speed of the carriage and the beam chases the moving carriage in describing the pattern. When, for example, the 5th master pulse is generated, the DA converter 49 is supplied with an input signal "1" and scanning is carried out in such a manner that the beam chases the moving carriage an amount of $1\mu$. When the 9th master pulse is generated or a pattern portion is described with a beam of $8\mu$ in width, scanning is effected in a manner that the beam chases the moving carriage an amount of $4\mu$. Then, when the 13th master pulse is generated or a pattern portion is described with a beam of $8\mu$ in width, the chasing beam overtakes the carriage being moved, so that the pattern portion is described in place in the Y-direction. Then, a pattern portion is described with a beam of $3\mu$ in width. In this case, the carriage being moved tends to be delayed and the beam scanning is effected in a state such that it awaits arrival of the carriage. The electron beam exposure device according to this invention is constructed to have such a buffer function that when a pattern portion corresponding to a narrow beam width is described the scanning is effected with the tendency of the beam to be delayed with respect to the carriage being moved and when a pattern portion corresponding to a width beam width is described the scanning is effected with the delay of the beam being taken back with respect to the moving carriage, permitting the pattern to be described at high speed.

When different pattern portions each corresponding to a narrow width beam long continue, the buffer function is not effectively utilized. It is therefore desirable that a pattern to be described be beforehand examined as a whole so that the carriage speed can be set as fast as possible according to the characteristic of the pattern. Even in the worst case, if the carriage speed is set down to a speed at which scanning is effected with the beam having a width of $1\mu$ it is possible to describe any arbitrary pattern. If the carriage speed does not exceed a predictable maximum speed, the carriage speed may be set at any lower speed. As a result, the described speed of the exposure device can be easily adjusted.

With the electron beam exposure apparatus according to this invention a normal IC pattern was described with a speed four times as fast as that of the conventional exposure apparatus. In the conventional apparatus, the speed of the raster scanning is suppressed to 20 Mbit/sec by a data rate at which the pattern data is extracted from a memory in a computer. According to this invention, however, a pattern can be described at a speed equivalent to a data rate of 80 Mbit/sec, a marked improvement over the conventional counterpart. Now assume that use is made of a large-sized computer having a data rate of 80 Mbit/sec. Even in this case, the conventional apparatus requires a blanking speed four times as fast. According to this invention, on the other hand, the blanking speed may be of the order of $5\mu$sec i.e. 1/10 of the address speed 50 sec and the describing speed can be held within a range maximally accessible to the data rate of the conventional electronic computer.

In the above-mentioned embodiment the moving speed of the carriage is determined by beforehand examining a pattern to be described. However, the adjustment of the carriage moving speed may be effected by controlling the carriage drive device according to the value of the Y-direction correction counter 36 so as to accelerate or brake the carriage. Although in the above-mentioned embodiment the electron beam illumination system is made stationary and the carriage movable, the electronic beam illumination system may be made movable and the carriage stationary. Alternatively, both may be made movable. The scanning direction of the beam may be in the direction parallel, orthogonal, or diagonal to the direction of movement of the carriage.

What is claimed is:

1. A radiant beam exposure apparatus for exposing an object by a plurality of radiant beam scanning lines to form a predetermined pattern on the object, comprising:

a radiant beam emitting system for emitting a radiant beam;

a memory for storing pattern information corresponding to a pattern to be described on the object, the pattern information including a pattern repetition information corresponding to the number of scanning lines continuously describing the same pattern;

means for varying the width of the radiant beam which includes a mask disposed on the path of the radiant beam and having a slit extending in a direction perpendicular to the scanning lines, a signal generator for generating upon receipt of the pattern repetition information from the memory a beam width signal having a level corresponding to the pattern repetition, and a beam shifting means connected to the signal generator for shifting the radiant beam by a distance corresponding to the level of the beam width signal in a longitudinal direction of the slit of the mask so as to vary the width of the radiant beam landing on the object;

a deflection means for deflecting the radiant beam to form the scanning lines;

means for blanking the radiant beam correspondingly to the pattern information read out from the memory; and a driving means for effecting a relative movement between the object and the radiant beam emitting system in two directions crossing each other.

2. A radiant beam exposure apparatus according to claim 1, wherein the driving means effects a relative movement between the object and the radiant beam emitting system in a first direction along the scanning lines and a second direction perpendicular to the first direction and which further comprises a circuit for detecting the relative movement in the second direction to generate a pulse signal having a number of pulses corresponding to the amount of the movement, a counter connected to the detecting circuit for counting the pulses from the detecting circuit, that count of said counter being reduced in response to the pattern repetition information, and a signal generating circuit connected to the counter for generating a second direction compensation signal in response to an output signal of the counter to compensate the second direction.

3. A radiant beam exposure apparatus according to claim 2, wherein said beam shifting means comprises at least one pair of main electrodes oppositely located at the radiant beam incident side of the mask with a radiant beam path therebetween and supplied with the beam width signal.

4. A radiant beam exposure apparatus according to claim 3, wherein the beam shifting means further includes a pair of correction electrodes for deflecting the deflected beam in the opposite direction to the beam direction deflected by the main electrodes to correct a deviation between an actual beam souce and an imaginary beam source of the beam deflected by said main electrodes.

* * * * *